(12) United States Patent
Jaussi

(10) Patent No.: US 7,019,592 B2
(45) Date of Patent: Mar. 28, 2006

(54) AMPLIFIER APPARATUS, METHOD, AND SYSTEM

(75) Inventor: James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/987,363

(22) Filed: Nov. 12, 2004

(65) Prior Publication Data

US 2005/0062536 A1    Mar. 24, 2005

Related U.S. Application Data

(62) Division of application No. 10/425,505, filed on Apr. 29, 2003, now Pat. No. 6,838,939.

(51) Int. Cl.
*H03F 3/45* (2006.01)
(52) U.S. Cl. ...................... 330/254; 330/253
(58) Field of Classification Search .............. 330/253, 330/254, 259, 260
See application file for complete search history.

(56) References Cited

U.S. PATENT DOCUMENTS

| | | | |
|---|---|---|---|
| 4,065,725 A * | 12/1977 | Lillis et al. ................. | 330/254 |
| 4,331,929 A * | 5/1982 | Yokoyama ................. | 330/254 |
| 6,011,437 A | 1/2000 | Sutardja et al. | |
| 6,023,192 A | 2/2000 | Didier | |
| 6,087,899 A | 7/2000 | Kubota | |
| 6,141,169 A | 10/2000 | Pietruszynski et al. | |
| 6,259,321 B1 | 7/2001 | Song et al. | |
| 6,396,351 B1 | 5/2002 | Buescher et al. | |
| 6,480,064 B1 | 11/2002 | Cyrusian | |
| 6,724,235 B1 | 4/2004 | Costa et al. | |
| 6,727,755 B1 * | 4/2004 | Islam et al. ................. | 330/254 |

* cited by examiner

*Primary Examiner*—Henry Choe
(74) *Attorney, Agent, or Firm*—LeMoine Patent Services, PLLC

(57) ABSTRACT

An amplifier includes multiple gain ranges. The gain range can be set by electrically adding or removing load devices.

19 Claims, 7 Drawing Sheets

AMPLIFIER APPARATUS, METHOD, AND SYSTEM

This application is a divisional of prior application Ser. No. 10/425,505, filed Apr. 29, 2003, U.S. Pat. No. 6,838,939, which is hereby incorporated herein by reference.

FIELD

The present invention relates generally to amplifier circuits, and more specifically to amplifier circuits having a wide input range.

BACKGROUND

Electrical signals become lower in amplitude, or "attenuated" as they travel through conductors in systems. For example, when two integrated circuits on a circuit board are coupled by signal conductors on the circuit board, an electrical signal transmitted by one integrated circuit may be received as an attenuated signal by the other integrated circuit. The amount of attenuation can be influenced by many factors, including the distance that the signal travels in the conductor. Signals that travel through long conductors tend to be more attenuated than signals that travel through short conductors.

Some systems have long conductors between circuits, and some systems have short conductors between circuits. Still some other systems have a mixture of short and long conductors between circuits. This leads to signals arriving at integrated circuits at various amplitudes. Amplifier circuits that receive signals are typically designed to receive them at a particular amplitude or range of amplitudes. Errors can result when signals at various amplitudes arrive at amplifiers designed to receive them at a particular amplitude.

For the reasons stated above, and for other reasons stated below which will become apparent to those skilled in the art upon reading and understanding the present specification, there is a need in the art for alternate amplifiers.

DESCRIPTION OF EMBODIMENTS

Figure 1:
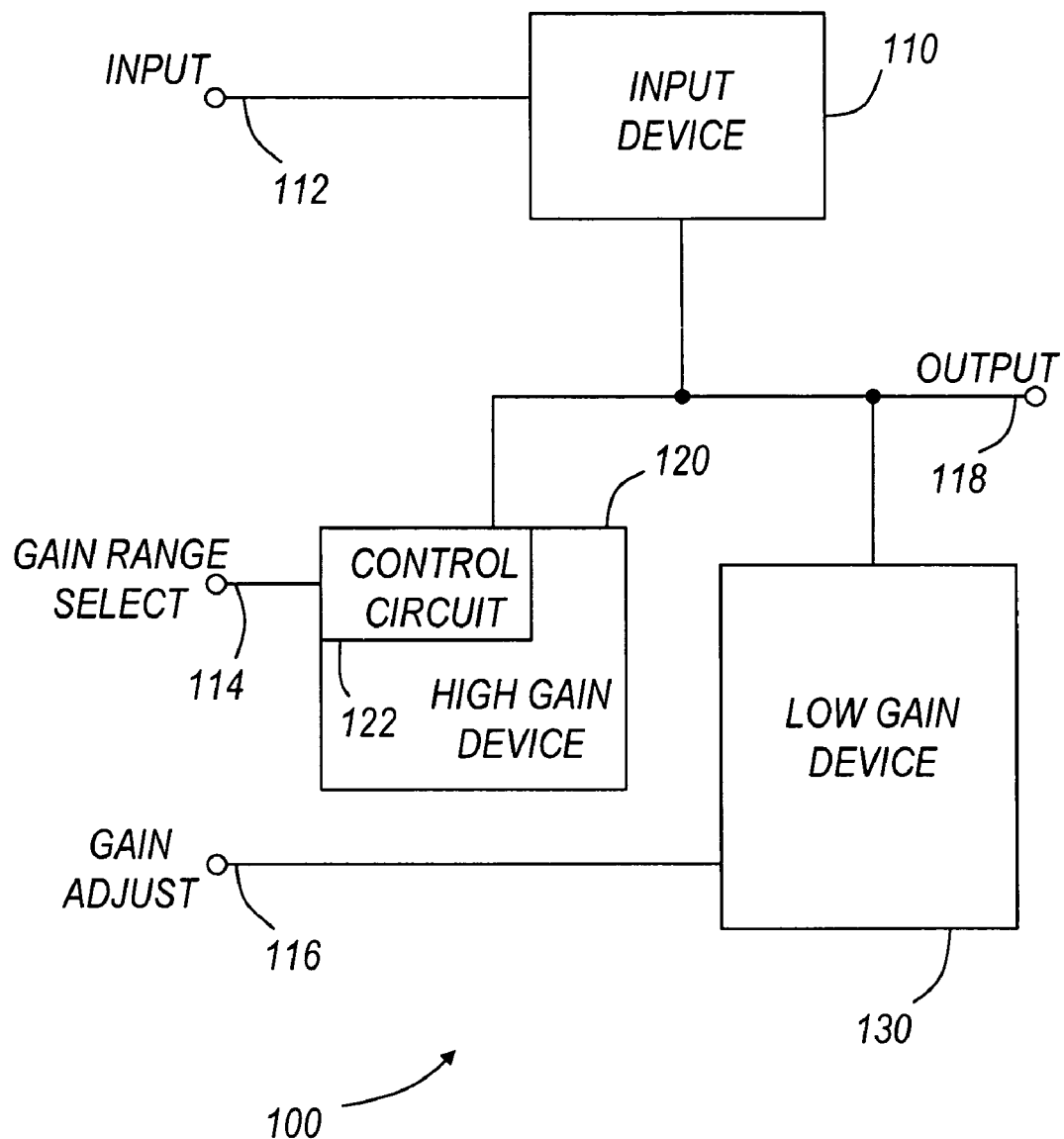
FIG. 1 shows a diagram of an amplifier.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of an amplifier. Amplifier 100 includes input device 110, high gain device 120, and low gain device 130. High gain device 120 and low gain device 130 are load circuits that are physically coupled in parallel. Input device 110 receives an input signal on input node 112, and amplifier 100 produces an output signal on node 118. Nodes 112 and 118 are each shown as a single node, however in some embodiments, nodes 112 and 118 include more than one signal conductor.

The output signal on node 118 is created in response to load characteristics presented by the parallel combination of high gain device 120 and low gain device 130. High gain device 120 includes control circuit 122. Control circuit 122 receives a "gain range select" control signal on node 114, and selects a gain range for amplifier 100 by changing the effect that high gain device 120 has on amplifier 100. Amplifier 100 operates in two modes: a first mode in which high gain device 120 is electrically removed from amplifier 100 by the action of control circuit 122; and a second mode in which high gain device 120 is electrically included in the circuit.

In the first mode, the gain range select signal on node 114 is asserted so that high gain device 120 is electrically removed from amplifier 100, and the output signal on node 118 is predominately affected by the load characteristics of low gain device 130. In this mode, a lower gain range is selected, and the overall gain of amplifier 100 is lower than in the second mode. Low gain device 130 receives a "gain adjust" control signal on node 116. The gain adjust control signal serves to vary the characteristics of low gain device 130, thereby adjusting the overall gain of amplifier 100 within the gain range selected by the gain range select signal on node 114.

In the second mode of operation, the gain range select signal on node 114 is asserted so that high gain device 120 is electrically included in amplifier 100, and the output signal on node 118 is predominately affected by the load characteristics of the parallel combination of high gain device 120 and low gain device 130. In this mode of operation, a higher gain range is selected, and the overall gain of amplifier 100 is higher than in the first mode. The gain adjust signal on node 116 can be used to vary the overall gain of amplifier 100 within the gain range selected by the gain range select signal on node 114.

Amplifier 100, and other amplifier embodiments described herein, are examples of "controllable gain amplifiers." The gain of the amplifiers is controllable by selecting a gain range, and the gain of the amplifier is further controllable by adjusting the gain within the range selected. A plurality of selectable load devices are coupled in parallel and a subset of the parallel connected load devices can be electrically added or removed to select a gain range.

Figure 2:
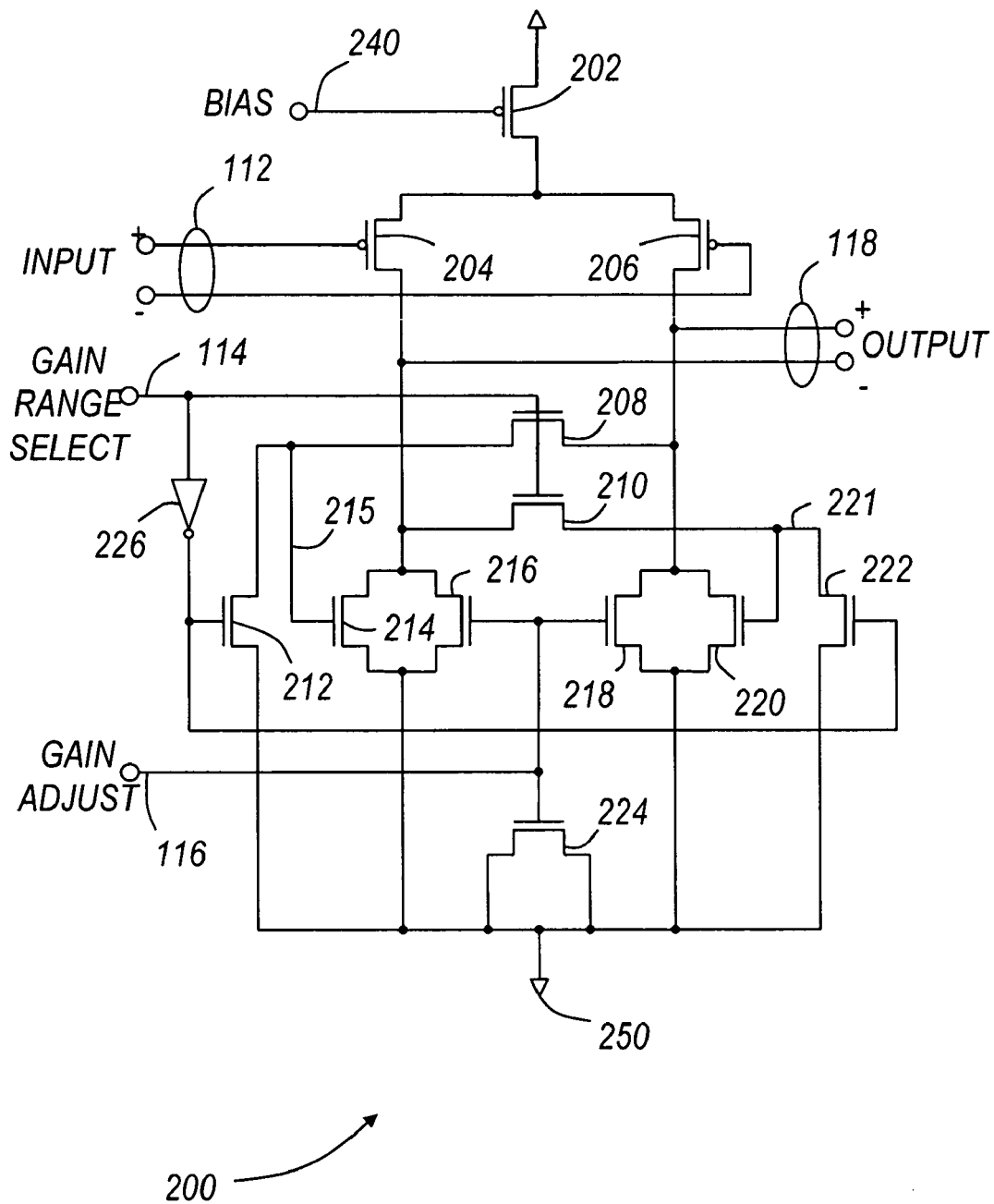
FIG. 2 shows a circuit schematic of an amplifier.

FIG. 2 shows a circuit schematic of an amplifier. Amplifier 200 includes transistors 202, 204, 206, 208, 210, 212, 214, 216, 218, 220, 222, and 224. Amplifier 200 also includes inverter 226. Transistors 204 and 216 form a differential input pair of transistors that receive a differential input signal on node 112. In embodiments represented by amplifier 200, node 112 includes two physical signal conductors to receive a differential input signal. Transistor 202 is a tail current device that provides current the differential input pair of transistors. Transistor 202 is biased by a signal on node 240. An output signal is created on node 118. In embodiments represented by amplifier 200, node 118 includes two physical signal conductors to produce a differential output signal.

Transistors 216 and 218 are low gain devices that correspond to low gain devices 130 (FIG. 1). Transistors 216 and 218 are coupled source-to-drain between the differential input pair and reference node 250, and have control nodes coupled to receive a control voltage, shown as the gain adjust signal on node 116. Transistor 224 is coupled to perform as a capacitor to filter the gain adjust control signal on node 116. In embodiments represented by amplifier 200, transistors 216 and 218 are not electrically removable from the circuit. Regardless of the state of the gain range select signal on node 114, characteristics of transistors 216 and 218 affect the gain of amplifier 200.

Transistors 214 and 220 are high gain devices that correspond to high gain devices 120 (FIG. 1). Transistors 214 and 220 are coupled drain-to-source in parallel with transistors 216 and 218, respectively. When the gain range select signal is set high, control nodes of transistors 214 and 220 are coupled to the output node 118 through pass transistors 208 and 210, and are said to be "electrically included" in the circuit. When the gain range select signal is set low, control nodes of transistors 214 and 220 are coupled to reference node 250, and are said to be "electrically removed" from the circuit.

Pass transistors 208, 210, 212, and 222, and inverter 226 are part of a control circuit that corresponds to control circuit 122 (FIG. 1). This control circuit receives the gain range select signal on node 114 and electrically removes the high gain devices from amplifier 200 when the gain range select signal is low.

Figure 3:
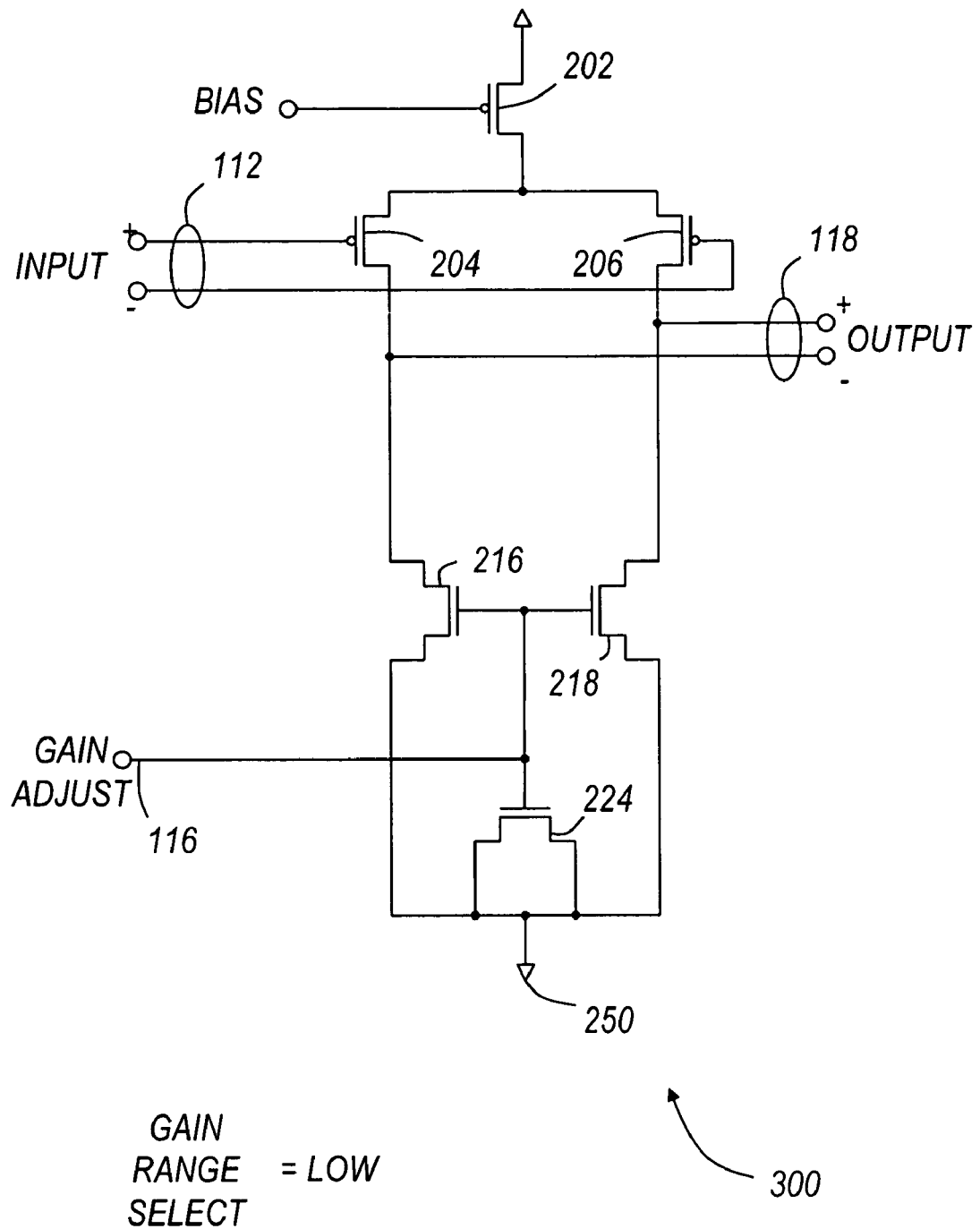
FIG. 3 illustrates a first mode of operation of the amplifier of FIG. 2.
Figure 4:
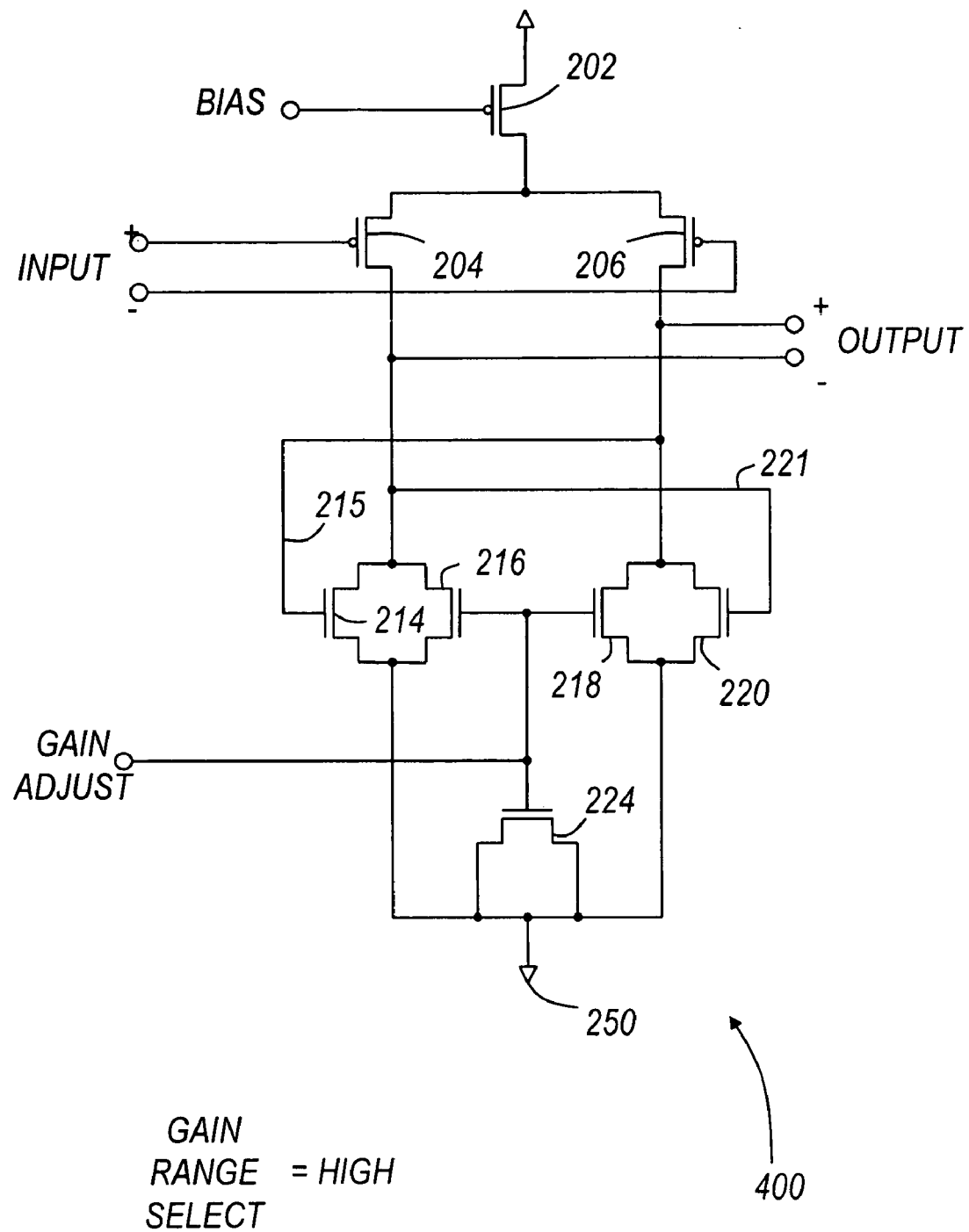
FIG. 4 illustrates a second mode of operation of the amplifier of FIG. 2.

The two operating modes are described in more detail with reference to FIGS. 3 and 4, below. FIG. 3 shows a circuit that is the electrical equivalent of amplifier 200 when the gain range select signal is low, and FIG. 4 shows a circuit that is the electrical equivalent of amplifier 200 when the gain range select signal is high.

The transistors shown in FIG. 2 are shown as isolated gate transistors, and specifically as metal oxide semiconductor field effect transistors (MOSFETs). Transistors 202, 204, and 206 are shown as P-type MOSFETs, and the remaining transistors are shown as N-type MOSFETs. Other types of switching or amplifying elements may be utilized for the various transistors of amplifier 200 without departing from the scope of the present invention. For example, the transistors of amplifier 200 may be junction field effect transistors (JFETs), bipolar junction transistors (BJTs), or any device capable of performing as input devices, low gain devices, and high gain devices as described above.

Various transistors within the disclosed embodiments have control nodes to receive bias voltages. For example, transistors 216 and 218 are shown as PMOSFETs having gate terminals configured as control nodes to accept a bias voltage referred to as "gain adjust." When other types of circuit elements are utilized for various embodiments of the present invention, the term "control node" refers to terminal types other than a gate of a MOSFET. For example, "control node" may refer to a base of a BJT, or other suitable node. Similarly, the term "drain-to-source" describes the current path from drain-to-source of a MOSFET. When other types of circuit elements are used, the term "drain-to-source" refers to the corresponding connection for the other circuit elements. For example, when BJTs are used, "drain-to-source" refers to "collector-to-emitter." The terminology used herein is not meant to be limiting, but rather is intended to encompass all equivalent structures and methods.

Inverter 226 is shown in FIG. 2 to illustrate the logical relationship between the various control signals that control the pass transistors of the control circuit. In some embodiments, inverter 226 is omitted. In some of these embodiments, separate gain range select signals are provided to pass transistors 208, 210, 212, and 214.

Transistor 224 is configured to provide a capacitance at node 116. This capacitance provides filtering to reduce voltage fluctuations on the control nodes of transistors 216 and 218. In some embodiments, a different type of capacitor is utilized. In other embodiments, transistor 224 is omitted, and no separate capacitive circuit element is included on node 116.

FIG. 3 illustrates a first mode of operation of the amplifier of FIG. 2. In this first mode of operation, the gain range select signal on node 114 (FIGS. 1, 2) is low, and the high gain devices are electrically removed from the amplifier. Accordingly, amplifier 300 shows transistors 202, 204, 206, 216, 218, and 224. Amplifier 300 does not show the high gain devices or the control circuit devices.

In operation, amplifier 300 receives a differential input signal on node 112 and produces an output signal on node 118. The output signal on node 118 corresponds to voltages developed across transistors 216 and 218, which is related to the load characteristics of transistors 216 and 218. The load characteristics (e.g., the impedance looking into the drains) of transistors 216 and 218 is related to the voltage of the gain adjust signal on node 116 which biases transistors 216 and 218. When the gain adjust signal is increased in voltage, the drain-to-source impedance of transistors 216 and 218 drops, and the gain of amplifier 300 drops. Conversely, when the gain adjust signal is decreased in voltage, the drain-to-source impedance of transistors 216 and 218 increases, and the gain of amplifier 300 also increases.

In the mode of operation represented by FIG. 3, the amplifier has a low gain range selected. This gain range may be selected in an application where the signal being received does not require amplification beyond that which can be provided by amplifier 300. For example, in some embodiments, the amplifier may be used as a receiver at an integrated circuit boundary, and this gain range may be selected when the received signal is not too attenuated.

FIG. 4 illustrates a second mode of operation of the amplifier of FIG. 2. In the second mode of operation, the gain range select signal on node 114 (FIGS. 1, 2) is high, and the high gain devices are electrically included in the amplifier. Accordingly, amplifier 400 shows the transistors of amplifier 300 (FIG. 3), and also shows transistors 214 and 220. For ease of illustration, amplifier 400 does not show the control circuit devices.

In operation, amplifier 400 receives a differential input signal on node 112 and produces an output signal on node 118. The output signal on node 118 corresponds to voltages developed across the parallel combination of the low gain devices (transistors 216 and 218) and the high gain devices (transistors 214 and 220). In embodiments represented by FIG. 4, transistors 214 and 220 are configured as positive feedback devices. The control nodes 215 and 221 of transistors 214 and 220 are coupled each other's drain terminal, which creates a positive feedback path, and increases gain.

The gain of amplifier 400 is increased as more current is available to flow drain-to-source through the high gain devices. As is the case in first mode of operation described above with reference to FIG. 3, when the gain adjust signal is increased in voltage, the drain-to-source impedance of transistors 216 and 218 drops, and more current flows in transistors 216 and 218. As more current flows in transistors 216 and 218, less current is available to flow through the high gain devices, and the gain of amplifier 400 drops. This is referred to as the low gain devices "robbing current" from the high gain devices. Conversely, when the gain adjust signal is decreased in voltage, less current flows drain-to-source through transistors 216 and 218 and more current is available to flow through the high gain devices, and the gain of amplifier 400 increases.

In the mode of operation represented by FIG. 4, the amplifier has a high gain range selected. This gain range may be selected in an application where the signal being received benefits from amplification beyond that which can be provided by amplifier 300 (FIG. 3). For example, in some embodiments, the amplifier may be used as a receiver at an integrated circuit boundary, and this gain range may be selected when the received signal is more attenuated.

Figure 5:
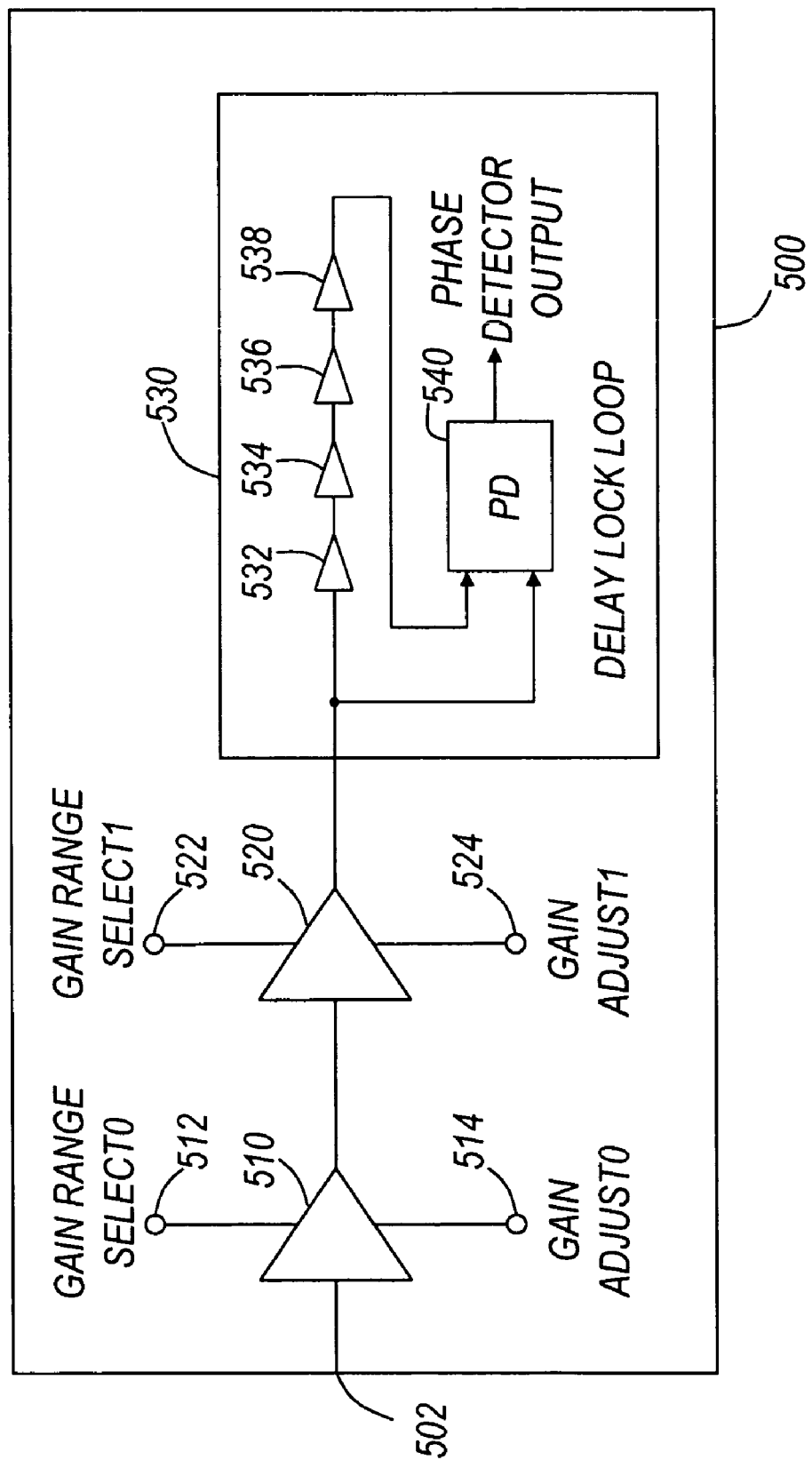
FIG. 5 shows an integrated circuit.

FIG. 5 shows an integrated circuit. Integrated circuit 500 includes delay lock loop 530 and controllable gain amplifiers 510 and 520. Integrated circuit 500 can be any type of integrated circuit capable of including one or more controllable gain amplifier as shown. For example, integrated circuit 500 can be a processor such as a microprocessor, a digital signal processor, a microcontroller, or the like. Integrated circuit 500 can also be an integrated circuit other than a processor such as an application-specific integrated circuit (ASIC), a communications device, a memory controller, or a memory such as a dynamic random access memory (DRAM). For ease of illustration, portions of integrated circuit 500 are not shown. Integrated circuit 500 may include much more circuitry than illustrated in FIG. 5 without departing from the scope of the present invention.

Controllable gain amplifier 510 receives a gain range select signal on node 512 and a gain adjust signal on node 514. Controllable gain amplifier 520 receives a gain range select signal on node 522 and a gain adjust signal on node 524. Controllable gain amplifiers 510 and 520 can each independently have a gain range selected, and can also each independently have the gain of the respective amplifier adjusted within the selected range using the respective gain adjust signal. Controllable gain amplifiers 510 and 520 can be any of the amplifier embodiments disclosed herein, including those shown in FIGS. 1 and 2.

Delay lock loop 530 includes delay elements 532, 534, 536, and 538, and phase detector (PD) 540. Delay lock loop 530 can include many more elements that are not depicted in FIG. 5. In some embodiments, delay elements 532, 534, 536, and 538 have a substantially fixed amount of gain and exhibit a delay that is dependent on the input amplitude. In other embodiments, each of the delay elements receives a control signal to change the amount of delay. For example, a filtered version of the phase detector output signal may be used to change the delay of delay elements 532, 534, 536, and 538.

By utilizing controllable gain amplifiers to drive the first delay element (delay element 532) in delay lock loop 530, the signal amplitude can be driven to a desired level at the input to delay lock loop 530. For example, when integrated circuit 500 is included in a system with long interconnects, the input signal received at node 502 may be attenuated. The attenuation can be overcome by setting the gain range of one or both of controllable gain amplifiers 510 and 520 to the high range, and then the overall gain can be adjusted by changing the gain adjust signals on nodes 514 and 524.

Controllable gain amplifiers, delay lock loops and combinations thereof, of the present invention can be implemented in many ways. In some embodiments, they are implemented in integrated circuits as part of a clock recovery or distribution system. In other embodiments, they are implemented as high speed serial transceivers. In some embodiments, design descriptions of the various embodiments of the present invention are included in libraries that enable designers to include them in custom or semi-custom designs. For example, any of the disclosed controllable gain amplifier embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, amplifier circuit 200 (FIG. 2) can be represented as polygons assigned to layers of an integrated circuit.

Figure 6:
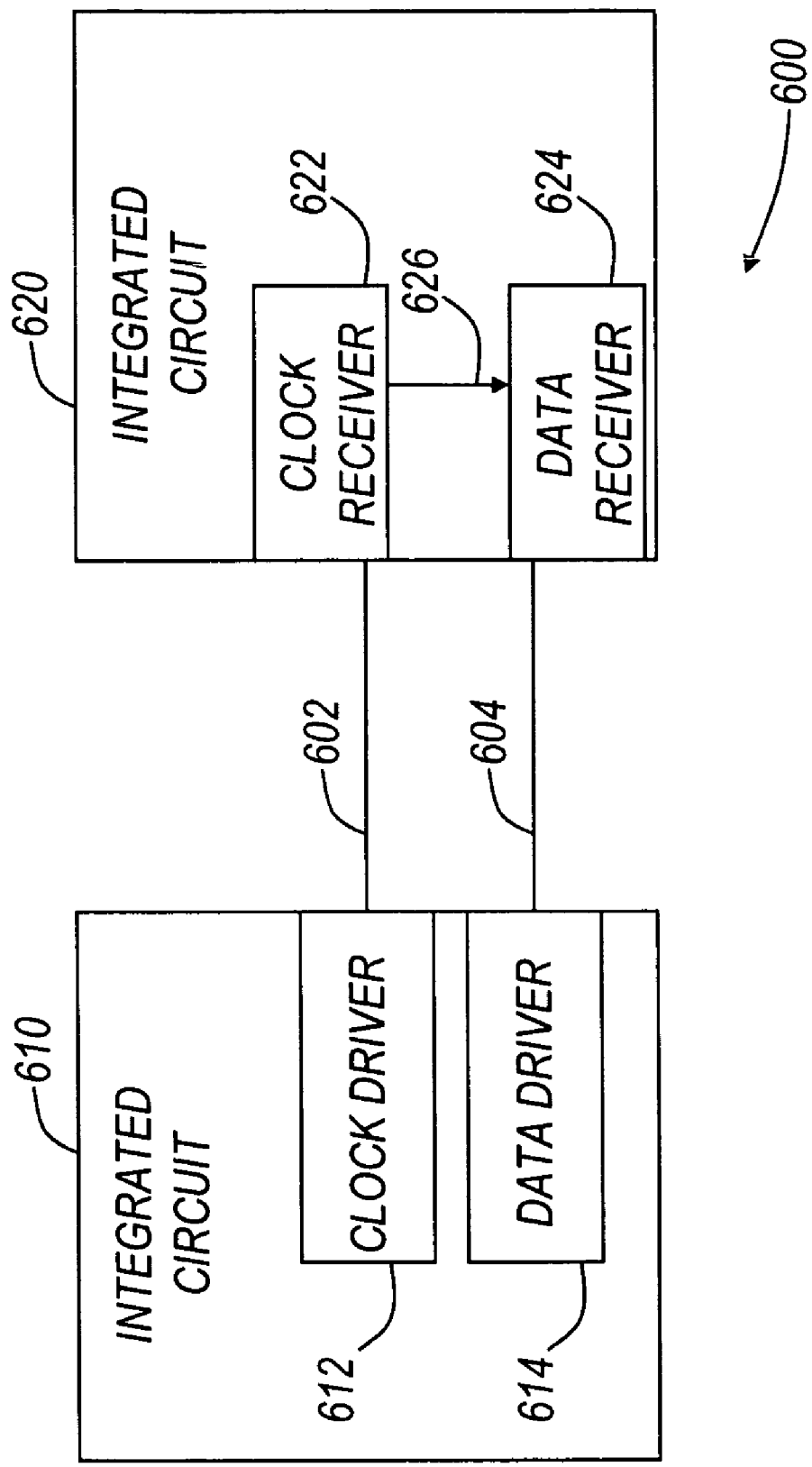
FIG. 6 shows a system diagram in accordance with various embodiments of the present invention.

FIG. 6 shows a system diagram in accordance with various embodiments of the present invention. Electronic system 600 includes integrated circuits 610 and 620. Integrated circuit 610 includes clock driver 612 and data driver 614, and integrated circuit 620 includes clock receiver 622 and data receiver 624. Integrated circuits 610 and 620 are coupled by conductors 602 and 604. Clock driver 612 drives conductor 602, and data driver 614 drives conductor 604. Clock receiver 622 receives a clock signal on conductor 602, and data receiver 624 receives a data signal on conductor 604.

Integrated circuits 610 and 620 may be coupled in any manner that facilitates communication on conductors 602 and 604. For example, integrated circuits 610 and 620 may be mounted on a common substrate such as a multi-chip module or circuit board. The integrated circuits may also be mounted on separate substrates that are interconnected, and the conductors 602 and 604 may serve to interconnect the separate substrates. For example, each of integrated circuits 610 and 620 may be mounted on separate circuit boards coupled by cabling. In these embodiments, conductors 602 and 604 represent signal traces on the substrates and the cabling that couples the signal traces on the substrates.

Conductors 602 and 604 may be of widely varying length. For example, in embodiments where integrated circuits 610 and 620 are mounted very close to each other, conductors 602 and 604 may be a small fraction of an inch. Also for example, in embodiments where integrated circuits 610 and 620 are mounted far from each other, the length of conductors 602 and 604 may be measured in feet, yards, or even miles. Accordingly, signals traveling on conductors 602 and 604 may experience different amounts of attenuation depending on the application of integrated circuits 610 and 620.

Clock receiver 622 may include one or more controllable gain amplifiers such as those described above. By utilizing controllable gain amplifiers with gain ranges that can be set, clock receiver 622 can operate effectively with a wide input amplitude range. For example, in embodiments that include amplifier 200 (FIG. 2) in clock receiver 622, very small amplitude signals can be received by setting the gain range select signal on node 114 high, which allows the amplifier to operate with high gain load devices. Also in these embodiments, larger amplitude signals can be received by setting the gain range select signal on node 114 low, which allows the amplifier to operate without the high gain devices.

In some embodiments, conductor 602 includes multiple signal traces. For example, in some embodiments, conductor 602 includes two signal traces, and clock receiver 622 includes a differential receiver with two input nodes. Also for example, conductor 604 may include multiple signal traces, and data receiver 624 may have multiple input nodes.

Integrated circuits 610 and 620 can be any type of integrated circuit. For example, either or both integrated circuits 610 and 620 can be a processor such as a microprocessor, a digital signal processor, a microcontroller, or the like. Integrated circuits 610 or 620 can also be an integrated circuit other than a processor such as an application-specific integrated circuit (ASIC), a communications device, a modem, a testing device, a network router, a memory controller, or a memory such as a dynamic random access memory (DRAM).

In some embodiments, integrated circuit 610 is a clock generation device that produces one or more clocks for system 600. In these embodiments, many integrated circuits 620 may be present in system 600, some or all of which receive clock signals from integrated circuit 610.

In some embodiments, the communications link represented by conductors 602 and 604 is a "source synchronous" link in which each integrated circuit that includes a data source also includes a clock source. For example, integrated circuit 610 may be a microprocessor, and integrated circuit 620 may be a memory device, where the link is a source synchronous link. The data on the link (conductor 604) is accompanied by a clock (conductor 602). In these embodiments, a single clock signal may accompany many data signals. For example, integrated circuit 610 may include many data drivers 614 for each clock driver 612.

Integrated circuit 620 may utilize the clock signal received by clock receiver 622 to latch data received by data receiver 624. For example, clock receiver 622 may provide a clock signal on node 626 to data receiver 624 to latch data into integrated circuit 620. In some embodiments, integrated circuit 620 includes many data receivers, and the clock signal on node 626 is used to latch data into many data receivers.

System 600 is shown in FIG. 6 having a unidirectional data interface, but this is not a limitation of the present invention. In some embodiments, both integrated circuit include clock receivers 622 with controllable gain amplifiers. In some of these embodiments, source synchronous communications links exist from each integrated circuit to the other. Many embodiments of system 600 exist with varying configurations of drivers, receivers, quantities of drivers and receivers, and directionality of drivers and receivers. Many embodiments also exist with differing numbers of integrated circuits, and differing configurations of interfaces between the integrated circuits.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 7:
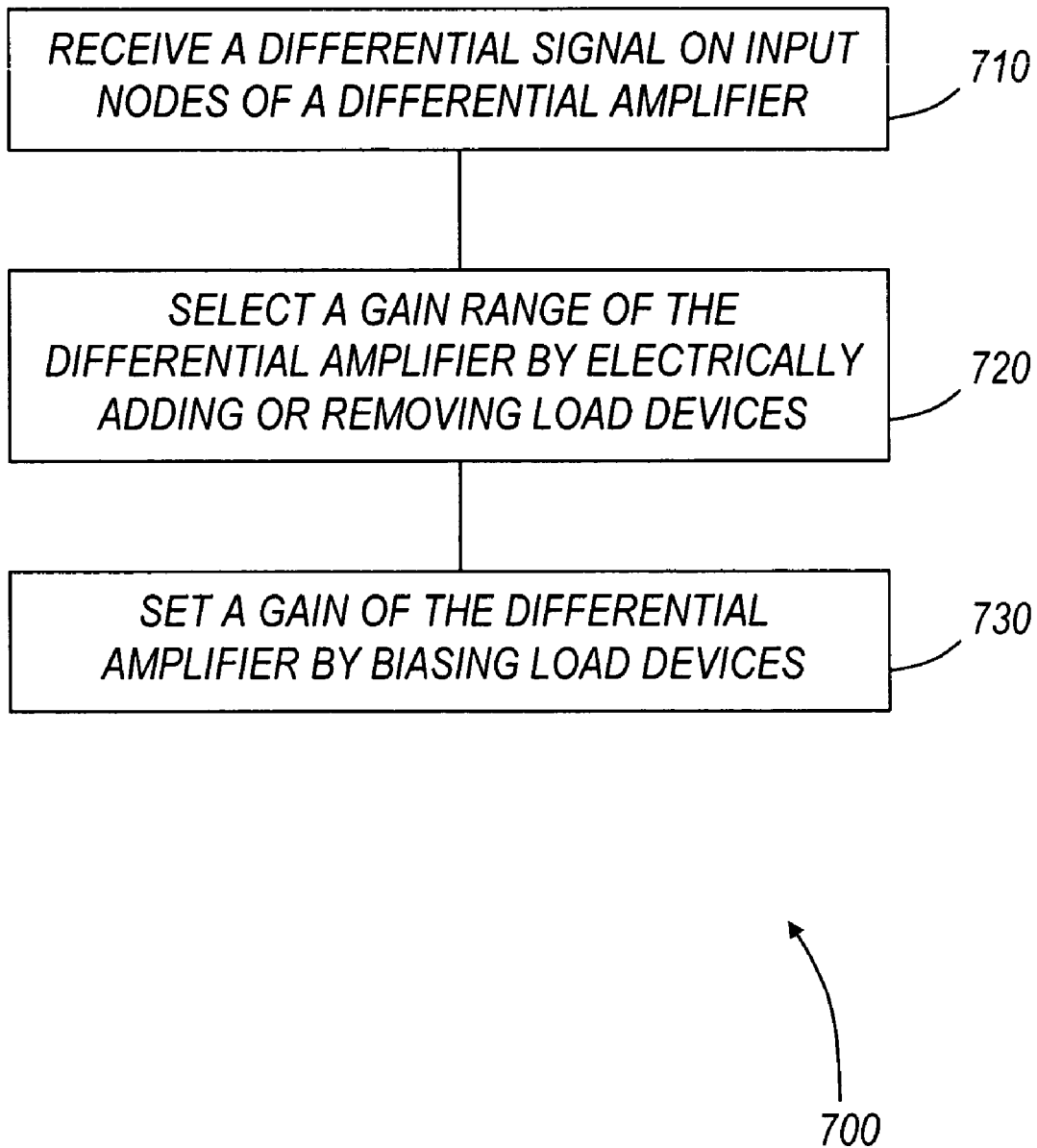
FIG. 7 shows a flowchart in accordance with various embodiments of the present invention.

FIG. 7 shows a flowchart in accordance with various embodiments of the present invention. In some embodiments, method 700, or portions thereof, is performed by a controllable gain amplifier, embodiments of which are shown in previous figures. In other embodiments, method 700 is performed by an integrated circuit or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which a differential signal is received on input nodes of a differential amplifier. In block 720, a gain range of the differential amplifier is selected by electrically adding or removing devices, and in block 730, a gain of the differential amplifier is adjusted by biasing load devices.

In some embodiments, method 700 corresponds to operating a controllable gain amplifier such as amplifier 100 (FIG. 1) or amplifier 200 (FIG. 2). In these embodiments, actions described in block 720 may correspond to operating control circuit 122 (FIG. 1) or driving control signals on control nodes of pass transistors 208, 210, 212, and 222 (FIG. 2). Referring now to FIG. 2, actions described in block 720 of method 700 may refer to electrically adding or removing high gain load devices 214 and 220. When high gain load devices 214 and 220 are electrically added to the circuit, they operate as positive feedback devices in parallel with low gain devices 216 and 218. When high gain load devices 214 and 220 are electrically removed from the circuit, low gain devices 216 and 218 operate as load devices without being in parallel with other load devices.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A differential amplifier comprising:
   a differential input transistor pair;
   output nodes coupled to the differential input transistor pair;
   a first pair of load transistors coupled to the output nodes, the first pair of load transistors having control nodes to accept a control voltage;
   a second pair of load transistors coupled in parallel with the first pair of load transistors, the second pair of load transistors having control nodes to be coupled to either an output node or a reference node; and
   pass transistors coupled between the control nodes of the second pair of load transistors and the output nodes.

2. The differential amplifier of claim 1 further comprising pass transistors coupled between the control nodes of the second pair of load transistors and a reference node.

3. A differential amplifier comprising:
   a differential input transistor pair;
   output nodes coupled to the differential input transistor pair;
   a first pair of load transistors coupled to the output nodes, the first pair of load transistors having control nodes to accept a control voltage; and
   a second pair of load transistors coupled in parallel with the first pair of load transistors, the second pair of load transistors having control nodes to be coupled to either an output node or a reference node;
   wherein the second pair of load transistors are coupled as high gain devices when the control nodes of the second pair of load transistors are coupled to the output nodes.

4. A differential amplifier comprising:
a differential input transistor pair;
output nodes coupled to the differential input transistor pair;
a first pair of load transistors coupled to the output nodes, the first pair of load transistors having control nodes to accept a control voltage; and
a second pair of load transistors coupled in parallel with the first pair of load transistors, the second pair of load transistors having control nodes to be coupled to either an output node or a reference node;
wherein the differential amplifier is configured to accommodate a first mode of operation with the control nodes of the second pair of load transistors coupled to the output nodes, and a second mode of operation with the control nodes of the second pair of load transistors coupled to the reference node.

5. The differential amplifier of claim 4 wherein the differential amplifier has a higher gain in the first mode of operation than in the second mode of operation.

6. A differential amplifier comprising:
a differential input transistor pair;
output nodes coupled to the differential input transistor pair;
a first pair of load transistors coupled to the output nodes, the first pair of load transistors having control nodes to accept a control voltage; and
a second pair of load transistors coupled in parallel with the first pair of load transistors, the second pair of load transistors having control nodes to be coupled to either an output node or a reference node;
wherein the first pair of load transistors exhibit a lower gain than the second pair of load transistors when the control nodes of the second pair of load transistors are coupled to the output nodes.

7. A differential amplifier comprising:
a differential input transistor pair;
output nodes coupled to the differential input transistor pair;
a first pair of load transistors coupled to the output nodes, the first pair of load transistors having control nodes to accept a control voltage; and
a second pair of load transistors coupled in parallel with the first pair of load transistors, the second pair of load transistors having control nodes to be coupled to either an output node or a reference node;
wherein the second pair of load transistors are coupled as positive feedback devices when the control nodes of the second pair of load transistors are coupled to the output nodes.

8. A differential amplifier including:
multiple selectable load devices configured to set a gain range of the differential amplifier, wherein at least one of the multiple selectable load devices is coupled as a positive feedback device;
a differential input pair of transistors, wherein the multiple selectable load devices comprise first load transistors coupled drain-to-source between the differential input pair of transistors and a reference node; and
pass transistors to conditionally turn off the first load transistors.

9. The differential amplifier of claim 8 wherein the first load transistors are configured as positive feedback devices.

10. The differential amplifier of claim 8 further comprising second load transistors coupled drain-to-source in parallel with the first load transistors.

11. The differential amplifier of claim 10 wherein the second load transistors share a common control node to vary a gain within the gain range selected.

12. The differential amplifier of claim 1 wherein the second pair of load transistors comprises metal oxide semiconductor transistors.

13. The differential amplifier of claim 3 further comprising pass transistors coupled between the control nodes of the second pair of load transistors and the output nodes.

14. The differential amplifier of claim 3 further comprising pass transistors coupled between the control nodes of the second pair of load transistors and a reference node.

15. The differential amplifier of claim 4 further comprising pass transistors coupled between the control nodes of the second pair of load transistors and the output nodes.

16. The differential amplifier of claim 6 further comprising pass transistors coupled between the control nodes of the second pair of load transistors and the output nodes.

17. The differential amplifier of claim 6 further comprising pass transistors coupled between the control nodes of the second pair of load transistors and a reference node.

18. The differential amplifier of claim 7 further comprising pass transistors coupled between the control nodes of the second pair of load transistors and the output nodes.

19. The differential amplifier of claim 7 further comprising pass transistors coupled between the control nodes of the second pair of load transistors and a reference node.

* * * * *